United States Patent
Yang et al.

(10) Patent No.: US 10,340,181 B2
(45) Date of Patent: Jul. 2, 2019

(54) INTERCONNECT STRUCTURE INCLUDING AIR GAP

(71) Applicant: TAIWAN SEMICONDUCTOR MANUFACTURING CO., LTD., Hsinchu (TW)

(72) Inventors: Tai-I Yang, Hsinchu (TW); Wei-Chen Chu, Taichung (TW); Hsin-Ping Chen, Hsinchu County (TW); Chih-Wei Lu, Hsinchu (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/353,850

(22) Filed: Nov. 17, 2016

(65) Prior Publication Data

US 2018/0138076 A1 May 17, 2018

(51) Int. Cl.
*H01L 21/768* (2006.01)
*H01L 23/528* (2006.01)

(52) U.S. Cl.
CPC .... *H01L 21/7682* (2013.01); *H01L 21/76885* (2013.01); *H01L 23/5283* (2013.01); *H01L 21/76852* (2013.01)

(58) Field of Classification Search
CPC ....... H01L 29/0649–0653; H01L 21/54; H01L 21/76865; H01L 21/76843; H01L 21/768
See application file for complete search history.

(56) References Cited

U.S. PATENT DOCUMENTS

| | | | | |
|---|---|---|---|---|
| 2006/0088975 A1* | 4/2006 | Ueda | ................. | H01L 21/76801 438/421 |
| 2010/0301489 A1* | 12/2010 | Seidel | ............... | H01L 21/76804 257/773 |
| 2014/0027908 A1* | 1/2014 | Tsai | .................. | H01L 21/76885 257/751 |
| 2014/0252625 A1* | 9/2014 | Ting | ................. | H01L 21/76883 257/751 |
| 2015/0076708 A1* | 3/2015 | Kaneko | ................ | H01L 21/764 257/774 |
| 2015/0137378 A1* | 5/2015 | Wu | ...................... | H01L 23/5222 257/773 |
| 2015/0262860 A1* | 9/2015 | Kao | .................... | H01L 21/7682 257/774 |
| 2015/0262937 A1* | 9/2015 | Liao | .................. | H01L 23/53238 257/758 |
| 2018/0158798 A1* | 6/2018 | Lin | ......................... | H01L 24/97 |

* cited by examiner

*Primary Examiner* — Changhyun Yi
(74) *Attorney, Agent, or Firm* — McClure, Qualey & Rodack, LLP

(57) ABSTRACT

A method of forming a semiconductor structure is provided. A conductive layer is formed over a substrate. The conductive layer is selectively etched to form a first conductive portion, a second conductive portion, and a spacing between the first conductive portion and the second conductive portion. A dielectric layer is formed over the first conductive portion, the second conductive portion, and the spacing, such that an air gap is formed in the spacing between the first and second conductive portions and is sealed by the dielectric layer.

20 Claims, 10 Drawing Sheets

INTERCONNECT STRUCTURE INCLUDING AIR GAP

BACKGROUND

The semiconductor integrated circuit (IC) industry has experienced rapid growth. Technological progress in IC manufacture has produced several generations of ICs, and each generation fabricates smaller and more complex circuits than the previous generation. Currently, the semiconductor industry has progressed into nanometer technology nodes for higher device density and better electrical performance. In the past, the reductions of the feature size were limited by the ability to define the structures photo-lithographically. Recently, device geometries having smaller dimensions created new challenges. For example, for two adjacent conductive lines, when the distance between the conductive lines is decreased, the semiconductor devices suffer from several electrical and processes issues. Conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
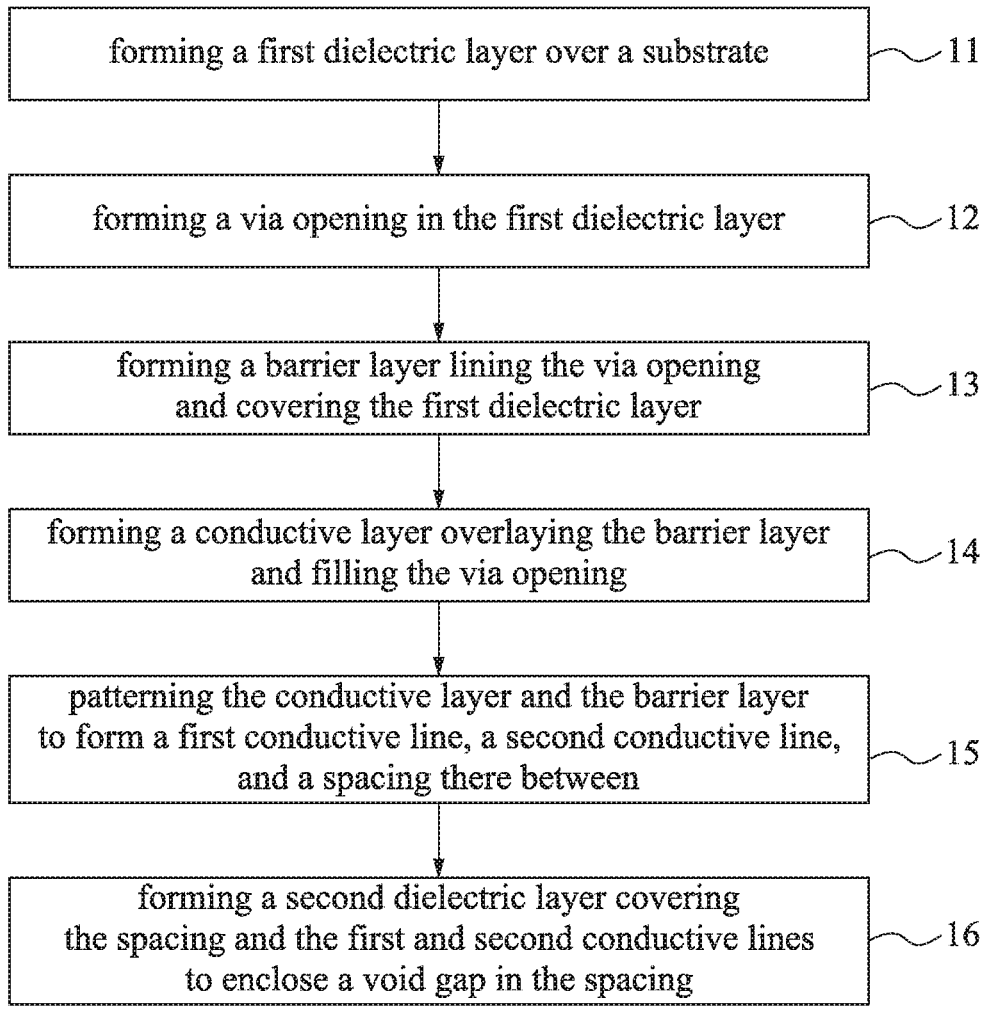
FIG. 1A is a flow chart illustrating a method of forming a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The semiconductor industry has continually improved the speed and power of integrated circuits (ICs) by reducing the size of components within the ICs. Several advanced techniques have been developed to implement technique nodes with smaller feature sizes. When the spacing between two adjacent conductive lines is smaller than a certain dimension, the semiconductor suffers from several issues such as RC delay, time dependent dielectric breakdown (TDDB), and parasitic capacitance. To improve these issues, an air gap is formed between two adjacent conductive lines as air has a low dielectric constant of 1. However, when the spacing between two adjacent conductive line is smaller than a certain dimension such as for example about 50 nm or less, conventional processes in the back-end of line (BEOL) suffer from process problems that degrade device performance and decrease the manufacture yield. Accordingly, one of the aspects of the present disclosure is to provide a solution to these problems.

The present disclosure relates generally to a semiconductor structure and a method of manufacturing the semiconductor structure. In embodiments, the method disclosed herein may be applied in BEOL, for example. According to various embodiments of the present disclosure, the method disclosed herein may form an in-situ air gap, which is self-aligned, between two adjacent conductive lines. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1A is a flow chart illustrating a method 10 of forming a semiconductor structure according to some embodiments of the present disclosure. The method 10 includes operation 11, operation 12, operation 13, operation 14, operation 15, and operation 16. FIGS. 2-13 collectively illustrate more detailed manufacturing methods as a series of cross-sectional views or plan views in accordance with some embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Referring to FIG. 1A, the method 10 includes an operation 11 of forming a first dielectric layer over a substrate.

Figure 2:
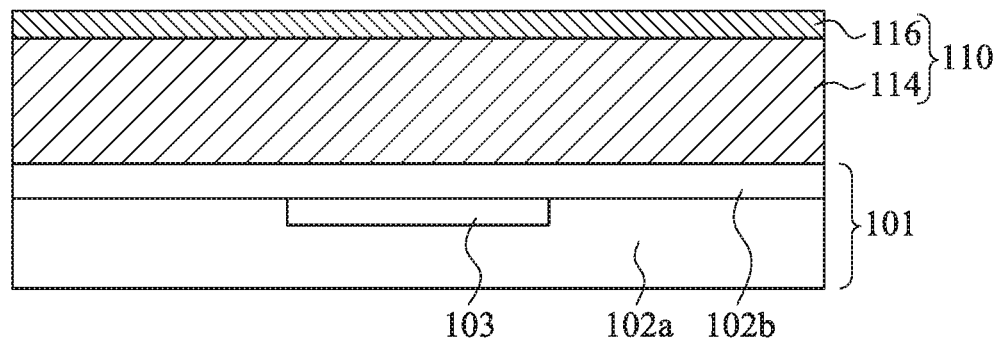
FIGS. 2-13 are drawings schematically illustrating a method of forming a semiconductor structure in various process stages according to various embodiment of the present disclosure.

FIG. 2 is a cross-sectional view schematically illustrating the formation of a first dielectric layer 110 over a substrate 101 according to some embodiments of the present disclosure.

In some embodiments, the substrate 101 may include a bulk silicon substrate. In yet some embodiments, the substrate 101 include an elementary semiconductor such as for example germanium or silicon in a crystalline structure. In yet some embodiments, the substrate 101 include a compound semiconductor such as for example gallium arsenic, silicon carbide, indium phosphide, gallium phosphide or indium antimonide, or combinations thereof. In yet some embodiments, the substrate may include an alloy semiconductor such as silicon germanium, silicon germanium carbide, gallium arsenic phosphide, and gallium indium phosphide. In some embodiments, the substrate 101 may include an integrated circuit 103. The integrated circuit 103 may include active devices such as transistors and the like. In some embodiments, the substrate 101 may include a semiconductor substrate 102a, a dielectric layer 102b over the semiconductor substrate 102a and the integrated circuit 103, and via contacts (not shown in FIG. 2) in the dielectric layer 102b and over the integrated circuit 103. The via contacts may be fabricated over the integrated circuit 103 such that the integrated circuit 103 may be electrically connected with other devices. In some embodiments, the substrate 101 has experienced processes of the front-end of line and a middle-end of line.

In some embodiments, the first dielectric layer 110 may include oxides such as silicon oxide, undoped silicate glass (USG), borophosphosilicate glass (BPSG), fluorinated silicate glass (FSG). In some embodiments, the first dielectric layer 110 may include low-k dielectrics such as carbon doped oxides, porous carbon doped silicon dioxide, a polymer such as polyimide, the like, or a combination thereof. The low-k dielectric materials may have k values lower than 3.9. The first dielectric layer 110 may be deposited by physical vapor deposition (PVD) processes, chemical vapor deposition (CVD) processes, atomic layer deposition (ALD) processes, a spin-on-dielectric (SOD) process, and the like.

In yet some embodiments, the first dielectric layer 110 includes a low-k layer 114 over the substrate 101 and an etching stop layer 116 on the low-k layer 114. Illustrative examples of the material of the etching stop layer 116 include TiN, SiN, $Al_xO_yN_z$, nitrogen doped silicon carbide, the like, and a combination thereof. The etching stop layer 116 may be formed by techniques such as for example PVD, CVD, SOD, ALD, and the like.

Figure 3:
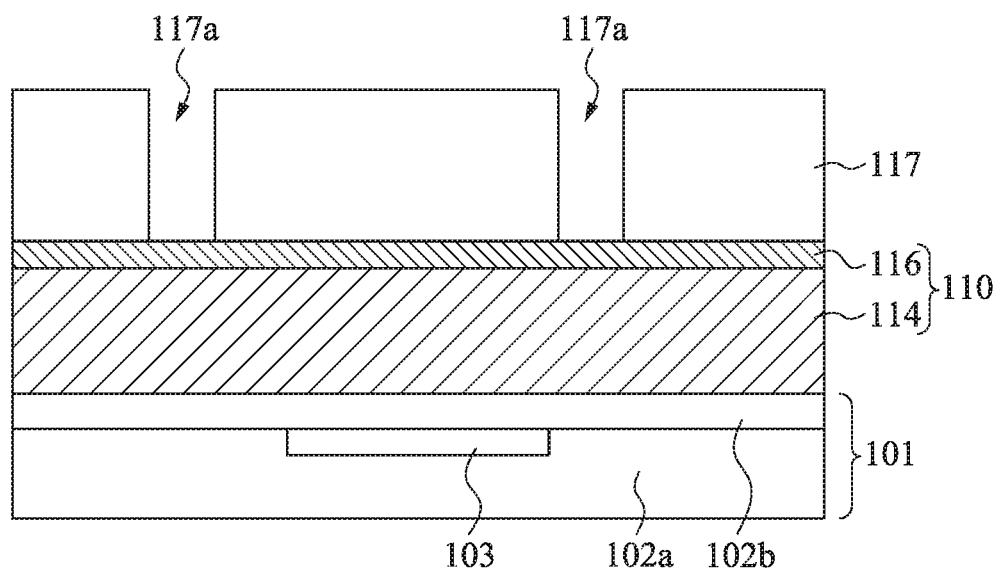
Figure 4:
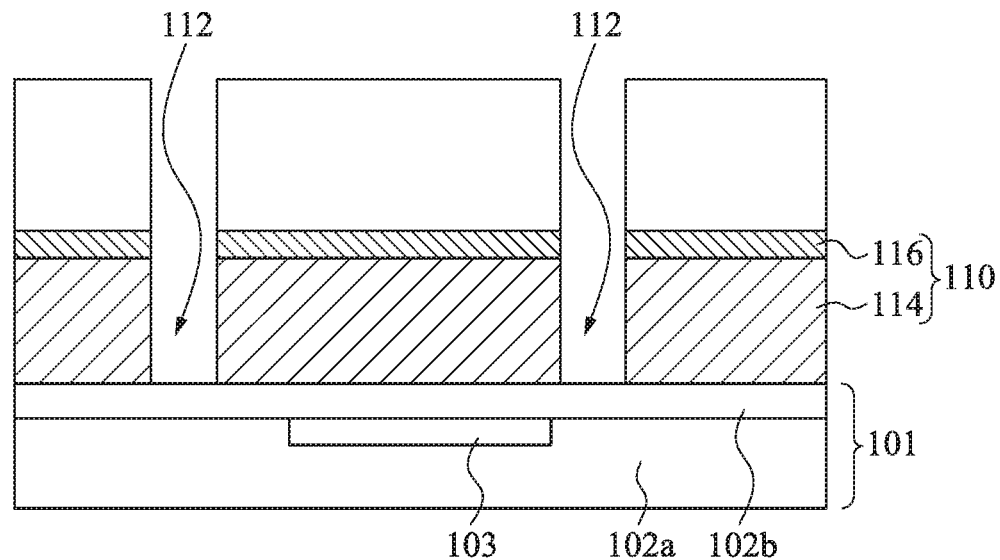

Referring to FIG. 1A, the method 10 proceeds to operation 12 by forming a via opening in the first dielectric layer. FIGS. 3-4 are cross-sectional view schematically illustrating the detailed steps of forming a via opening 112 in the first dielectric layer 110 according to some embodiments of the present disclosure. In FIG. 3, a patterned masking layer 117 with one or more opening 117a are formed over the first dielectric layer 110. The patterned masking layer 117 may include a photoresist layer or a hard mask layer. The illustrated patterned masking layer 117 may include a bottom layer, a middle layer, an antireflective coating (not shown), and/or the like. In FIG. 4, an etching process is performed to form one or more via openings 112 in the first dielectric layer 110. The etching process may includes wet etching processes or dry etching process such as for example reactive ion etching techniques or plasma etching techniques. After forming the via opening 112, the patterned masking layer may be removed according to some embodiments of the present disclosure.

Figure 5:
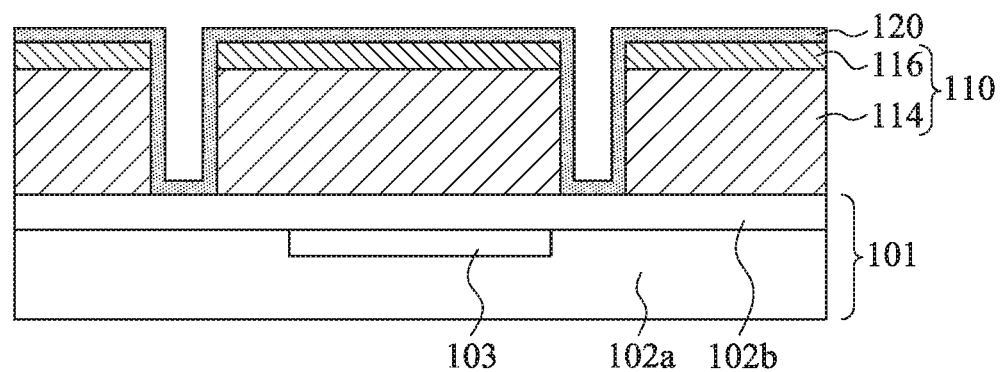

Referring to FIG. 1A and FIG. 5, the method 10 proceeds to operation 13 by forming a barrier layer 120 lining the via opening 112 and covering the first dielectric layer 110. Illustrative examples of the material of the barrier layer 120 includes Ta, TaN, and Co, the like, and a combination thereof. The barrier layer 120 may prevent the metallic material, which is formed in subsequent processes, from migration to the first dielectric layer 110 according to some embodiments of the present disclosure.

Figure 6:
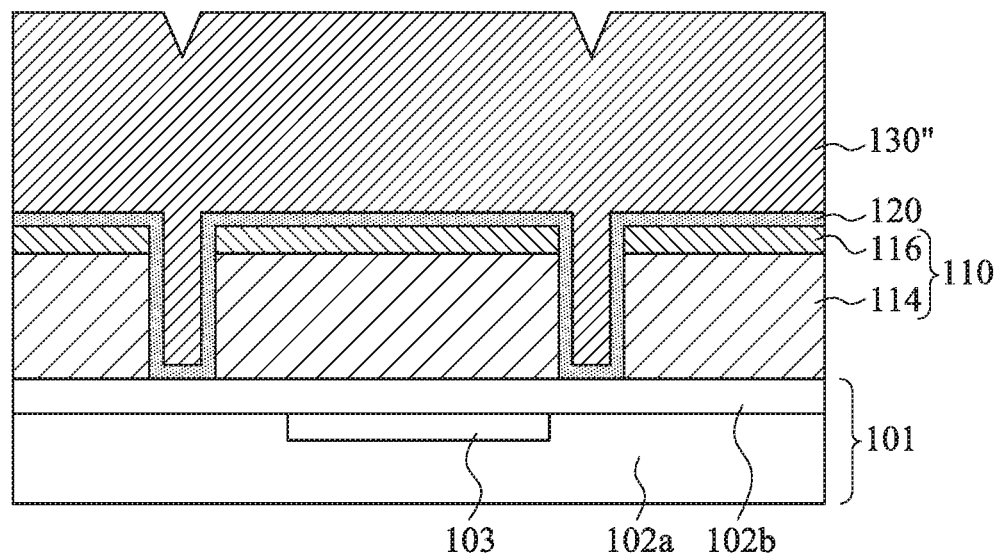
Figure 7:
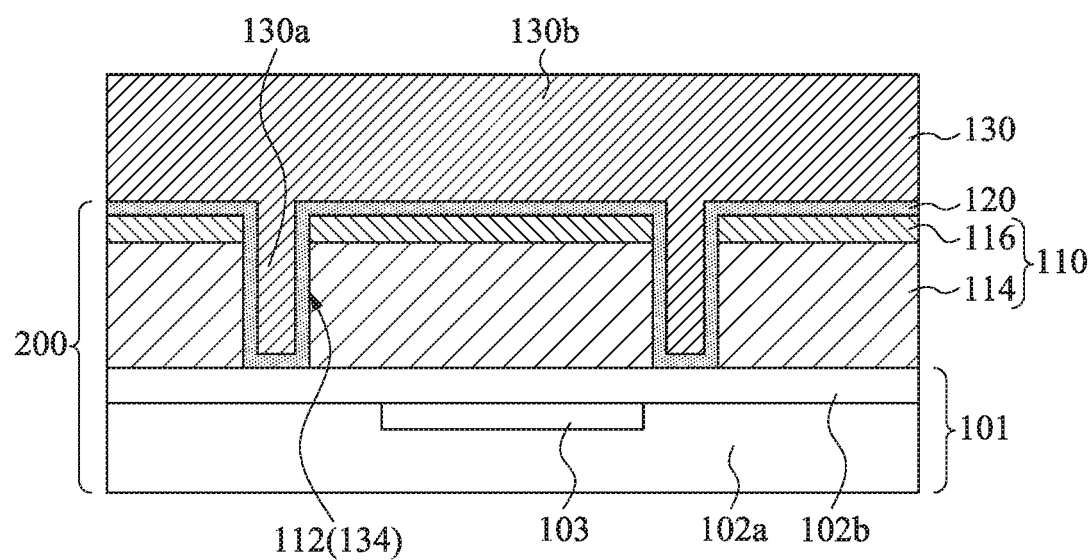

Referring still to FIG. 1A, the method 10 proceeds to operation 14 by forming a conductive layer overlaying the barrier layer and filling the via opening. FIGS. 6-7 are cross-sectional view schematically illustrating the detailed steps of operation 14. In FIG. 6. a metal layer 130" is deposed overlaying the barrier layer 120 and filling the via opening 112. In FIG. 7, a planarization process such as for example chemical mechanical polishing (CMP) process may be carried out on the top of the metal layer 130" so as to form the conductive layer 130. The conductive layer 130 is formed overlaying the barrier layer 120 and filling the via opening 112. Illustrative examples of conductive layer 130 includes Cu, Al, W, Co, the like, and a combination thereof. The conductive layer 130 includes a first portion 130a filled in the via opening 112. The first portion 130a and the barrier layer 120 in the via opening 112 collectively constitutes one or more via contacts 134 for vertical interconnection. The conductive layer 130 further includes a second portion 130b over the first dielectric layer 110 and the barrier layer 120. The planarization process does not remove all of the second portion 130b of the metal layer 130", and most of the second portion 130b of the metal layer 130" may be left. Accordingly, the planarization process disclosed herein differs essentially from the CMP used in the damascene or dual damascene processes.

Figure 8:
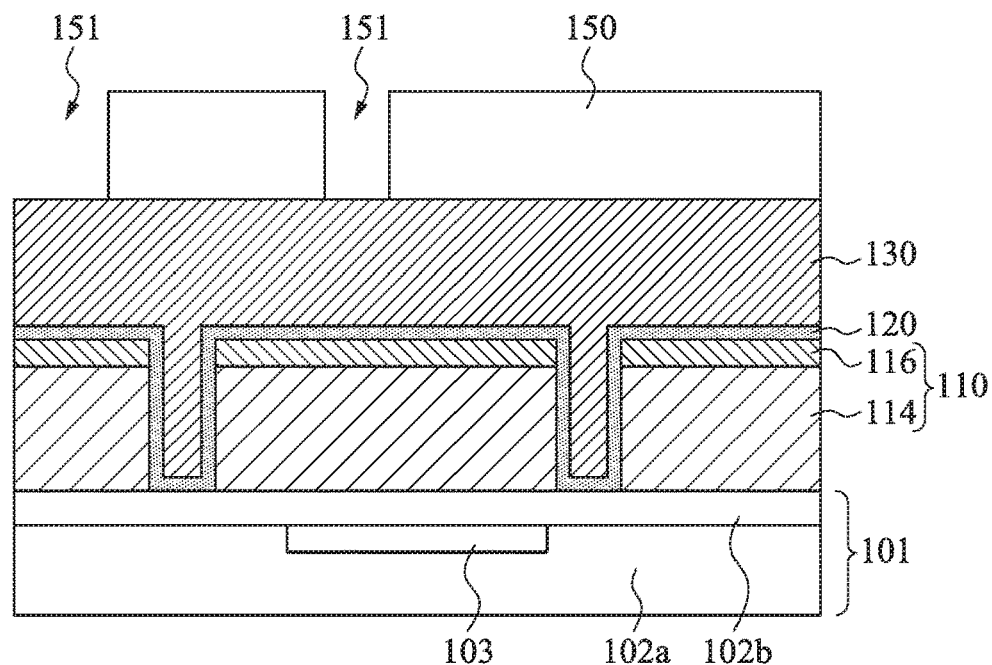
Figure 9A:
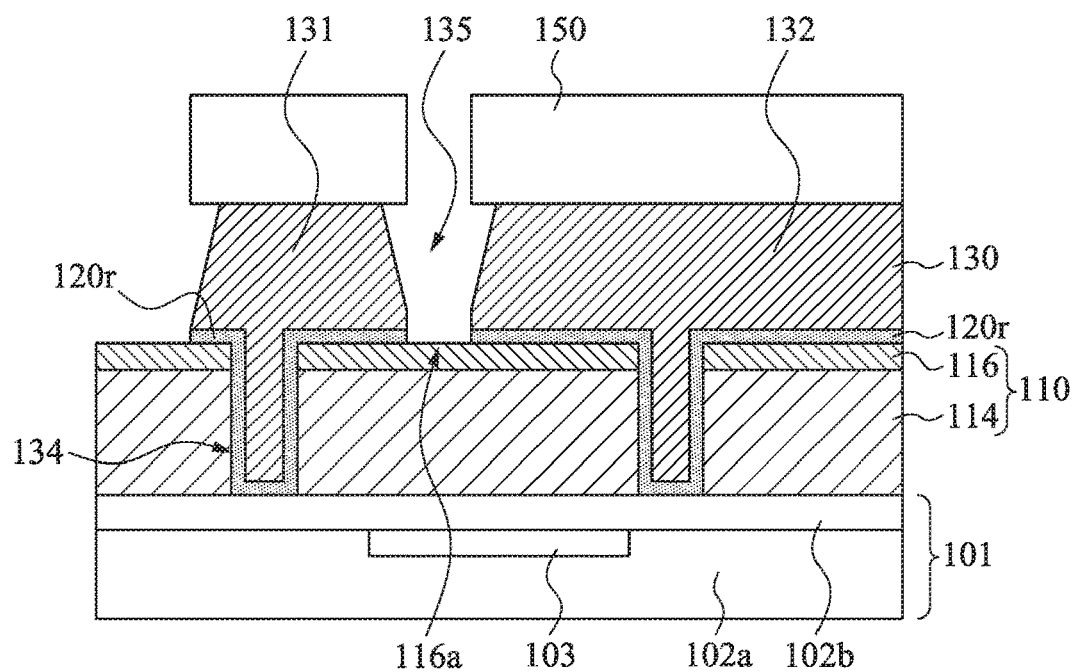

Turning back to FIG. 1A, the method 10 proceeds to operation 15 by patterning the conductive layer and the barrier layer to form a first conductive portion, a second conductive portion, and a spacing there between. FIGS. 8 and 9A are cross-sectional view schematically illustrating the detailed steps of operation 15 according to some embodiments of the present disclosure. As shown in FIG. 8, a masking layer 150 is formed over the conductive layer 130. The masking layer 150 has a pattern with one or more openings 151 exposing portions of the conductive layer 130. In some embodiments, the masking layer 150 may be a single-layered structure or a multiple-layered structure including a bottom layer, a middle layer, an antireflective coating, and/or the like. Next, as shown in FIG. 9A, the conductive layer 130 and the barrier layer 120 are patterned to form a first conductive portion 131, a second conductive portion 132, and a spacing 135 between the first conductive portion 131 and second conductive portion 132. In some embodiments, pattering the conductive layer 130 and the barrier layer 120 includes transferring the pattern of the masking layer 150 to the conductive layer 130 and the barrier layer 120. For example, patterning the conductive layer 130 and the barrier layer 120 may include selectively etching the conductive layer 130 and the barrier layer 120, thereby forming the first conductive portion 131, the second conductive portion 132, and the spacing 135. In some embodiments, at least one of the first and second conductive portions 131, 132 is physically connected to the via contacts 134. The spacing 135 may cut through both of the conductive layer 130 and the barrier layer 120. Accordingly, the remained portions 120r of the barrier layer 120 are under the first conductive portion 131 and the second conductive portion 132. In addition, the spacing 135 reveals or exposes a portion of the first dielectric layer 110. For example, the exposed portion of the first dielectric layer 110 may be a portion 116a of the etching stop layer 116 of the first dielectric layer 110, as shown in FIG. 9A. In some embodiments, the selectively etching process may includes wet etching processes or dry etching process such as for example plasma etching techniques or reactive ion etching (RIE) techniques. In examples, the selectively etching process employs RIE techniques using etchant including at least one of $Cl_2$, $F_2$, $H_2$, and $C_xF_y$ such as $CF_4$, $CHF_3$, $CH_2F_2$, $C_2HF_5$, and $C_2H_2F_4$.

Figure 9B:
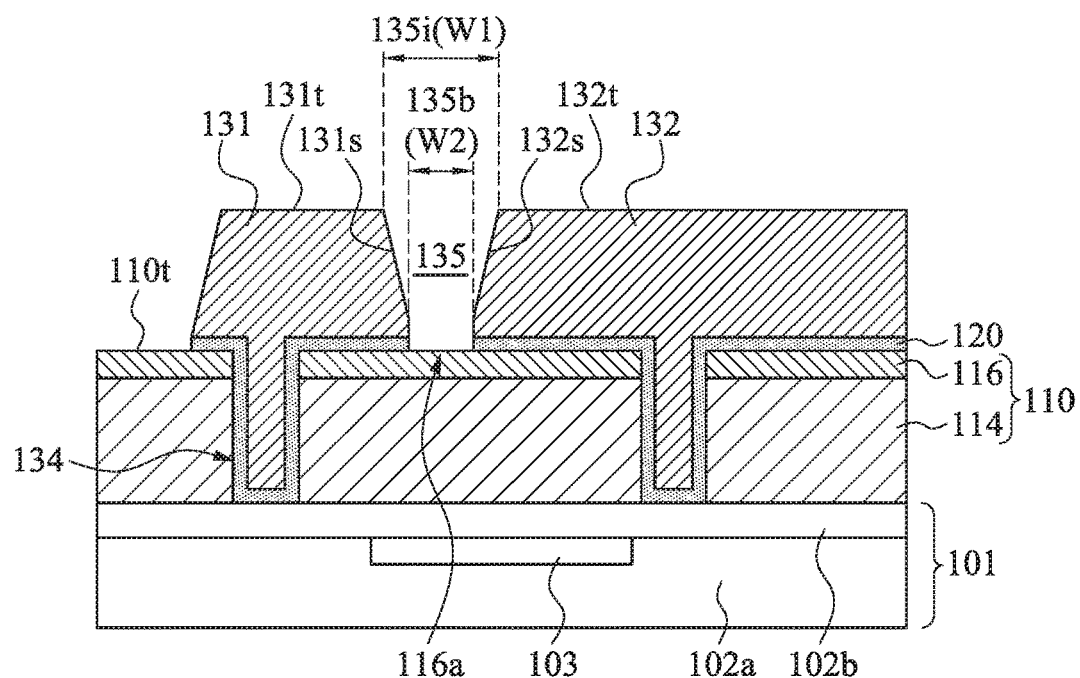

Referring to FIG. 9B, the masking layer 150 may be removed after the formation of the first conductive portion 131, the second conductive portion 132, and the spacing 135, according to some embodiments of the present disclosure.

It various embodiments, the first and second conductive portions 131, 132 are not completely formed or embedded in the trenches or vias of the first dielectric layer 110, and therefore the first and second conductive portions 131, 132 are different from the damascene conductive regions. In some embodiments, the top surfaces 131t of the first conductive portions 131 and the top surface 132t of the second conductive portions 132 extend at a substantially identical level that is higher than a top surface 110t of the first dielectric layer 110. Further, the sidewalls 131s, 132s of the first and second conductive portions 131, 132 are exposed and constitutes the lateral surfaces of the spacing 135. Accordingly, the embodiments disclosed herein differs essentially from the damascene or dual damascene processes.

As shown in FIG. 9B, the spacing 135 may include an inlet 135i having a width W1 and a bottom 135b having a width W2. The width W1 of the inlet 135i is greater than the width W2 of the bottom 135b according to some embodiments of the present disclosure. In some examples, the width W1 of the inlet 135i may be ranged from about 60 nm to about 5 nm, more specifically from about 50 nm to about 5 nm. For example, the width W1 may be about 5 nm, 7 nm, 10 nm, 20 nm, and 40 nm. In addition, the width W2 of the bottom 135b may be ranged from about 50 nm to about 3 nm, specifically from about 45 nm to about 5 nm, more specifically from about 40 nm to about 16 nm.

Figure 9C:
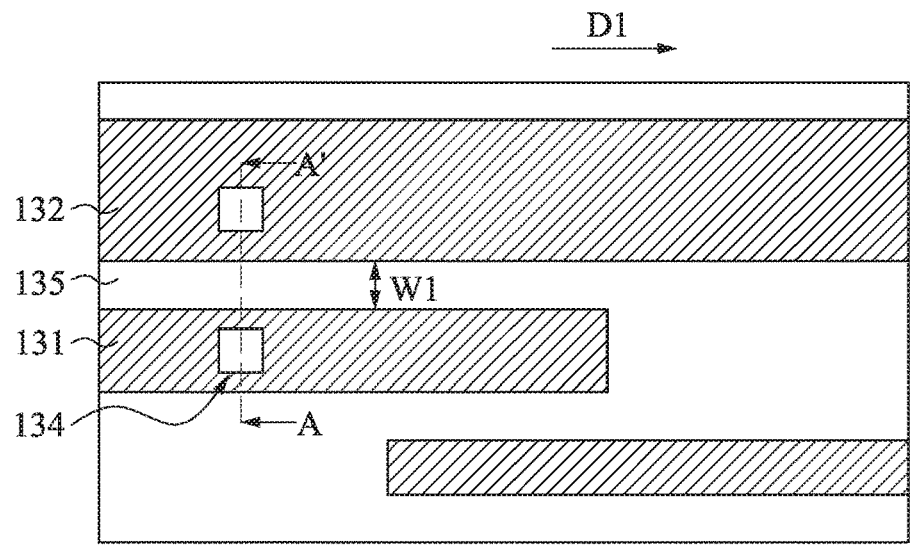

FIG. 9C illustrates a top view of FIG. 9B according to some embodiments of the present disclosure, in which FIG. 9B is taken along line A-A' in FIG. 9C. As shown in FIG. 9C, the first conductive portion 131 and second conductive portion 132 are conductive lines or wirings so that the first conductive portion 131 and second conductive portion 132 may also refer to a first conductive wiring 131 and second conductive wiring 132 in some embodiments of the present disclosure. Further, the spacing 135 is present between the first conductive portion 131 and second conductive portion 132. In some embodiments, the first conductive portion 131, the second conductive portion 132, and the spacing 135 extend along a first direction D1. In examples, the first conductive portion 131, the second conductive portion 132, and the spacing 135 may be substantially parallel with each other.

Figure 10:
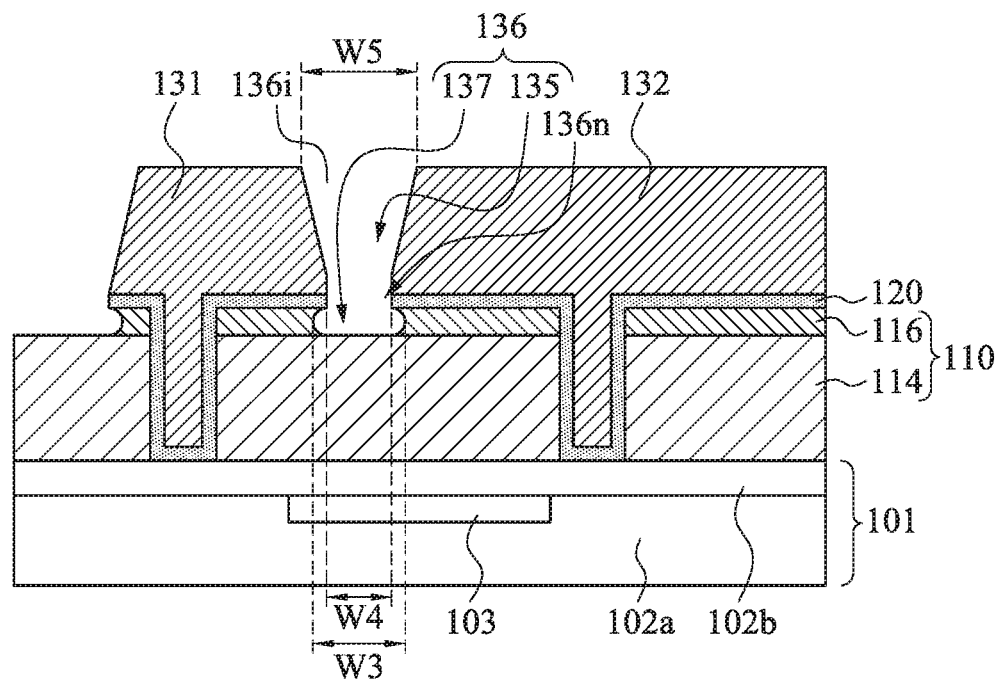

Referring to FIG. 10, the method 10 may optionally include an act of selectively etching the first dielectric layer 110 to form an aperture 137 under the spacing 135, after forming the first conductive portion 131, the second conductive portion 132, and the spacing 135. In some embodiments, selectively etching the first dielectric layer 110 includes removing the exposed portion 116a of the etching stop layer 116 of the first dielectric layer 110 using the first and second conductive portions 131, 132 as a mask, thereby forming an aperture 137 under the spacing 135. In some examples, the aperture 137 has a width W3 less than the width W1 of the inlet 135i of the spacing 135 (shown in FIG. 9B). In yet some examples, the width W3 of the aperture 137 is greater than the width W2 of the bottom 135b of the spacing 135 (shown in FIG. 9B). In yet some embodiments, the aperture 137 communicates with the spacing 135. The spacing 135 and the aperture 137 collectively form a void region 136. The spacing 135 forms an upper portion of the void region 136, and may also refer to as the upper portion 135 of the void region 136. The aperture 137 forms a bottom portion of the void region 136, and may also refer to as the bottom portion 137 of the void region 136. In some examples, the void region 136 includes a neck portion 136n, which has a minimum width W4 through out the void region 136. The ratio of the width W4 of the neck portion 136n to the width W5 of the inlet 136i of the void region 136 may be ranged from about 0.5 to about 0.95, specifically from 0.6 to 0.95, more specifically from 0.8 to 0.95. It is noted that the width W5 of the inlet 136i may be the same as or different from the width W1 of the inlet 135i of the spacing 135. In some embodiments, the width W1 of the inlet 135i is possibly changed during selectively etching the etching stop layer 116 of the first dielectric layer 110. In embodiments, the selectively etching process may includes wet etching processes or dry etching process such as for example plasma etching techniques and/or reactive ion etching (ME) techniques.

Figure 11:
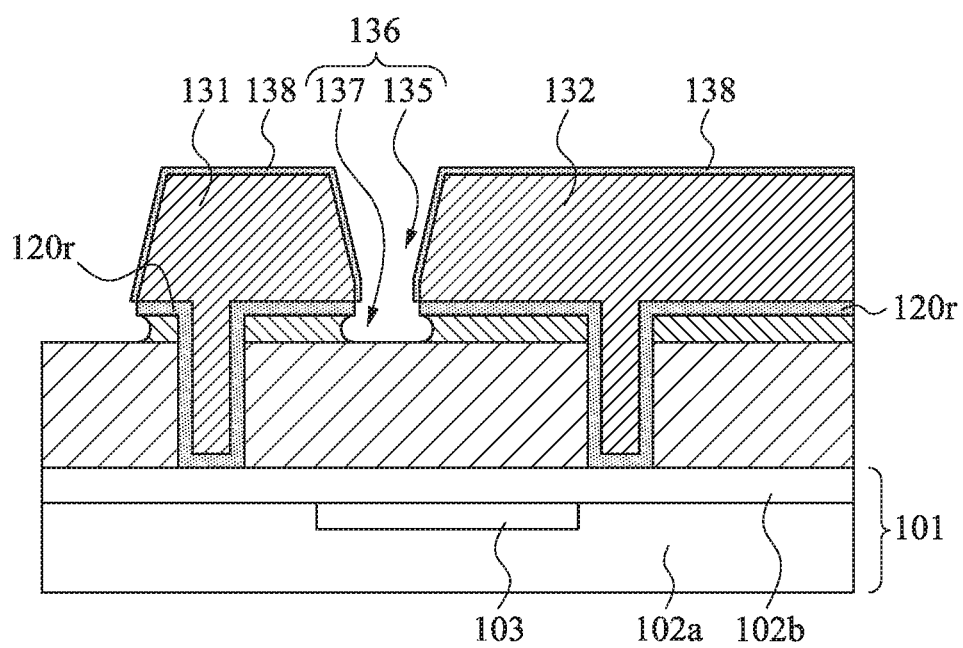

Referring to FIG. 11, after the formation of the aperture 137, the method 10 may optionally include an act of forming a capping layer 138 covering the first and second conductive portions 131, 132. In some embodiments, the capping layer 138 covers the top and sidewalls of each of the first and second conductive portions 131, 132. Accordingly, the first and second conductive portions 131, 132 are encapsulated by the capping layer 138 and the remained portions 120r of the barrier layer 120. In some examples, the capping layer 138 includes material such as for example cobalt silicide (Co—$Si_x$), Co, Mn, Ru, the like, and a combination thereof. The capping layer 138 and the remained portions 120r of the barrier layer 120 may suppress or prevent the material of the conductive portions 131, 132 from migration to the dielectric formed in the subsequent processes.

In yet some embodiments, the capping layer 138 may be formed prior to the formation of the aperture 137. For example, the capping layer 138 may be formed immediately after the patterning of the conductive layer 130 and the barrier layer 120 depicted in FIG. 9B.

Referring back to FIG. 1A, the method 10 proceeds to operation 16 by forming a second dielectric layer covering the spacing and the first and second conductive portions to enclose a void gap in the spacing. FIG. 12 A is a cross-sectional view illustrating the formation of a second dielectric layer 140. The second dielectric layer 140 covers the first and second conductive portions 131, 132 and the void region 136 (or spacing 135) there between. It is noted that the void region 136 is not filled with the second dielectric layer 140 so that an in-situ formed void gap 142 is fabricated at the position of the void region 136 between the first and second conductive portions 131, 132. The void gap 142 may also referred to as an air gap 142. In some embodiments, the second dielectric layer 140 may be formed by non-conformal chemical vapor deposition techniques, spin-on coating techniques, and the like. The void gap 142 may be formed under the second dielectric layer 140 by selecting suitable material for the deposited material and/or process parameters. Illustrative examples of suitable materials for the second dielectric layer 140 includes, but not limited to, nitrogen doped silicon carbide, oxygen doped silicon carbide, TEOS, $Si_3N_4$, and the low-k material, and the like. The air gap or void gap 142 with low dielectric constant (e.g., 1) may improve various electrical interferences between the first and second conductive portions 131, 132, such as the parasitic capacitance and RC delay of the conductive features of back-end of line (BEOL). Further, electromigration (EM) and time dependent dielectric breakdown (TDDB) of devices may be improved.

Figure 12A:
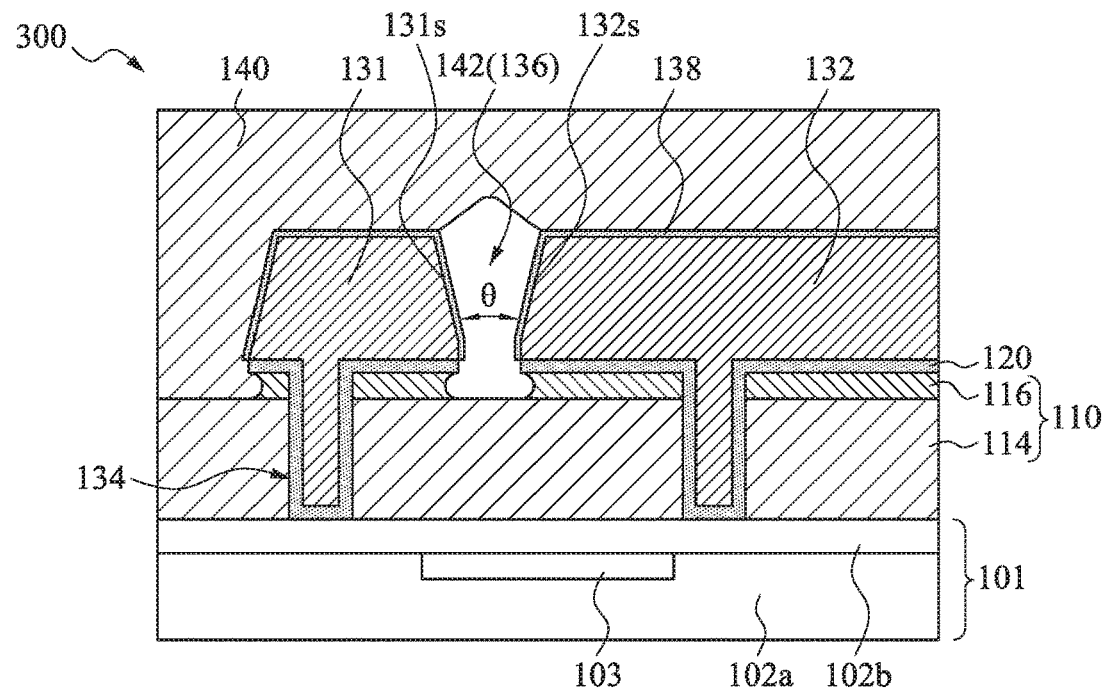
Figure 12B:
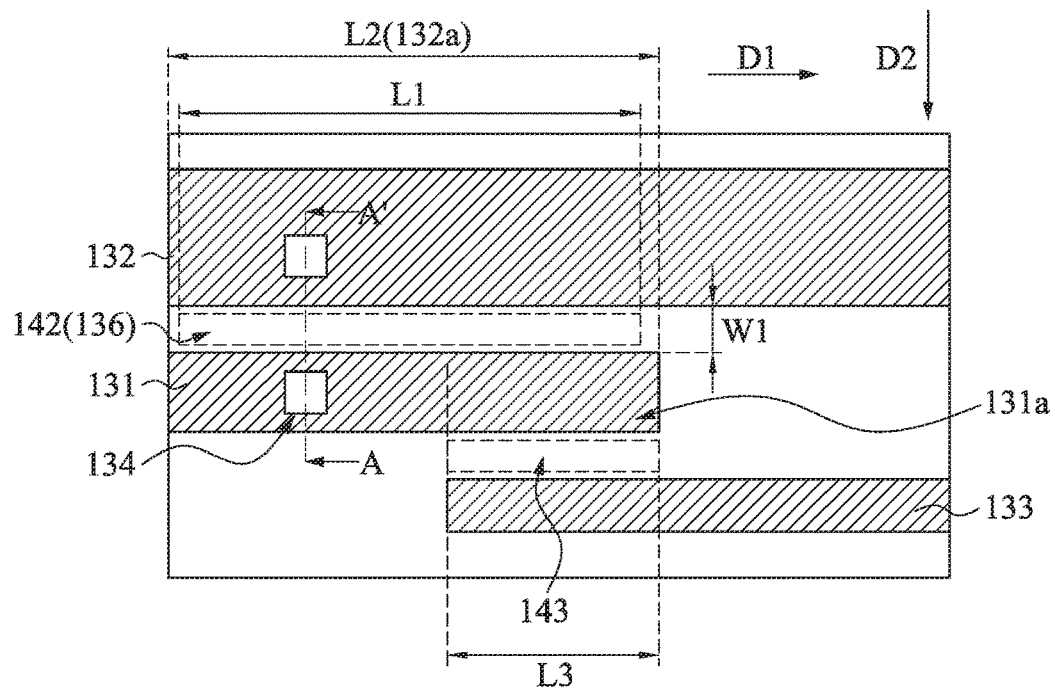

FIG. 12 B is a top view illustrating the structure of FIG. 12A, in which FIG. 12 A is taken along line A-A' in FIG. 12B. The void gap 142 is in-situ formed in position of the void region 136 (or spacing) between the first and second conductive portions 131, 132. Furthermore, the void region 136 (or spacing) may be concurrently formed with the first and second conductive portions 131, 132 according to some embodiments of the present disclosure. Therefore, the formation of the air gap or void gap 142 does not require an addition photolithographic process so that the method disclosed herein is cost effective, according to some embodiments of the present disclosure. Furthermore, in convention methods where the air gap is formed using an addition mask, it suffers misalignment issues in advanced technical nodes. To the contrary, the embodiments disclosed herein advantageously involves an in-situ method of forming the air gap or void gap between the first and second conductive portions 131, 132, and therefore the misalignment issues in convention techniques are avoid.

Figure 13:
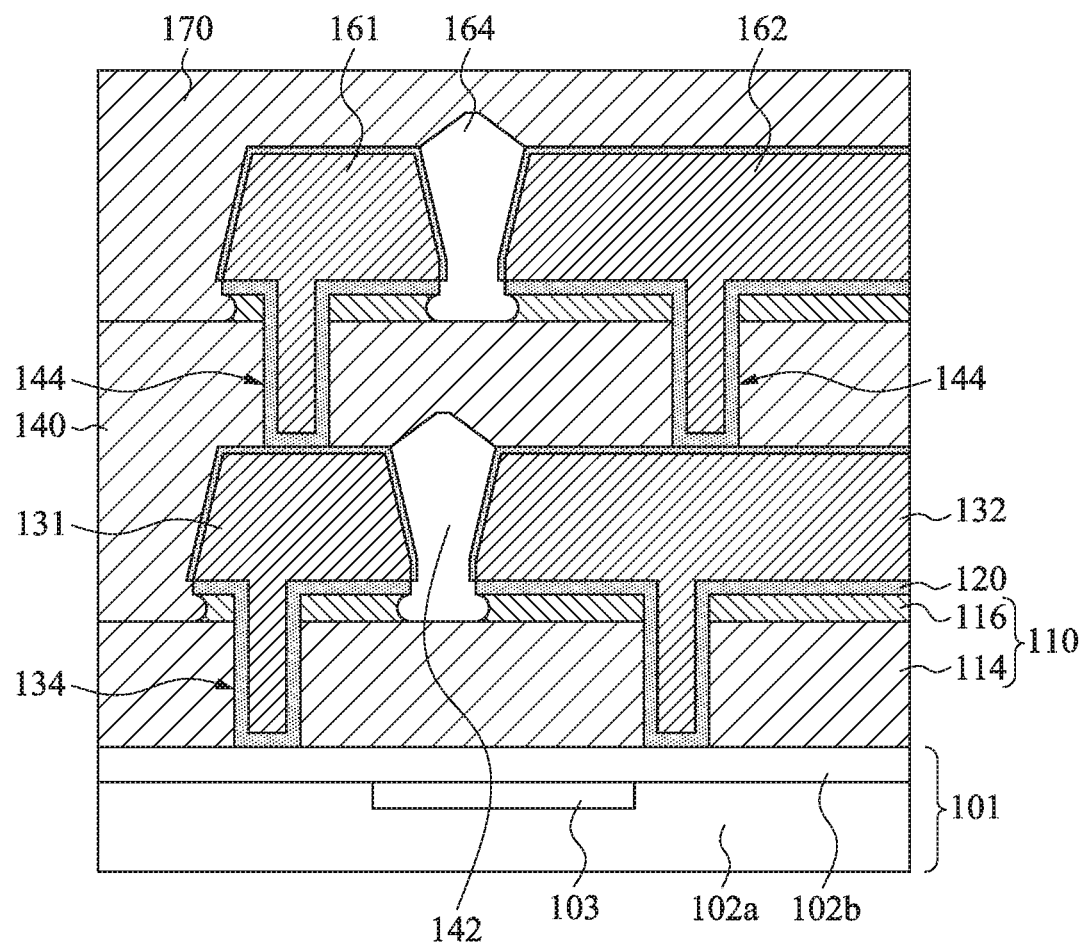

After operation 16, the method 10 may include other operations or steps. FIG. 13 illustrates additional via contacts 144 formed in second dielectric layer 140, and conductive lines 161, 162 formed over the second dielectric layer 140. The via contacts 144 are electrically coupled to the respective underlying conductive portions 131, 132. The conductive lines 161, 162 are disposed over and electrically coupled to respective underlying via contacts 144. A dielectric layer 170 is formed covering the conductive lines 161, 162 and the second dielectric layer 140. An air gap 164 may be formed the between conductive lines 161 and 162 and between the dielectric layers 170 and 170. The formation process may be essentially the same as in FIGS. 2 through 12A, and are not repeated herein.

Figure 1B:
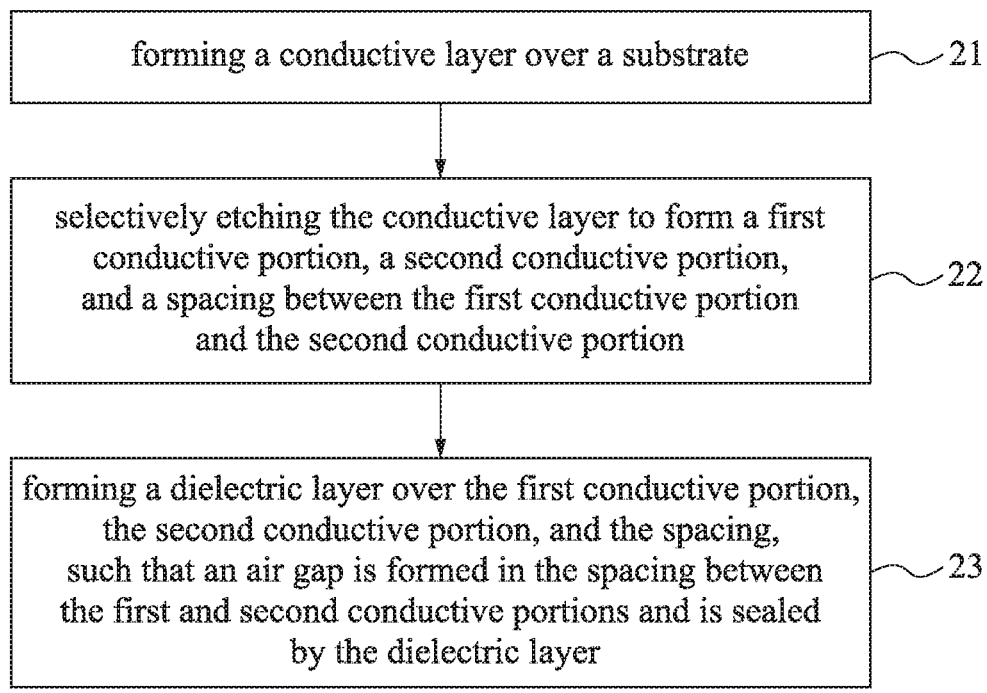
FIG. 1B is a flow chart illustrating a method according to various embodiments of the present disclosure.

FIG. 1B is flowchart illustrating a method 20 according to various embodiments of the present disclosure. The method 20 includes an operation 21 of forming a conductive layer over a substrate. FIG. 7 illustrates the formation of a conductive layer 130 over a substrate 200. In some embodiments, the substrate 200 may include a substrate 101, a first dielectric layer 110 over the substrate 101, a via opening 112 formed in the first dielectric layer 110. In yet some embodiments, the substrate 200 further includes a barrier layer 120 on the first dielectric layer 110 and lining the via opening 112. In yet some embodiments, the conductive layer 130 may fill the via opening 112 and cover the first dielectric layer 110. The portion of the first dielectric layer 110 filled in the via opening 112 constitutes a via contact 134 in the first dielectric layer 110 according to some embodiments of the present disclosure.

Referring to FIG. 1B, the method 20 proceeds to operation 22 by selectively etching the conductive layer to form a first conductive portion, a second conductive portion, and a spacing between the first conductive portion and the second conductive portion. Referring to FIG. 9B, the conductive layer 130 is selectively etched to form a first conductive portion 131, a second conductive portion 132, and a spacing 135. The spacing 135 between the first conductive portion 131 and the second conductive portion 132. In some embodiments, the spacing 135 includes an inlet 135i and a bottom 135b, and the width of the inlet is greater than a width of the bottom.

After operation 22, the method 20 may optionally includes an act of removing a portion 116a of the substrate between the first conductive portion 131 and the second conductive portion 132 according to some embodiments of the present disclosure. The resulting structure is shown in FIG. 10. The removal of the portion 116a forms an aperture 137 under the spacing 135. The spacing 135 and the aperture 137 collectively constitutes a void region 136.

Referring to FIG. 11, the method 20 may optionally includes an act of forming a metal capping layer 138 covering the first and second conductive portions 131, 132 after the formation of the aperture 137. However, in yet some embodiments, the metal capping layer 138 may be formed prior to the formation of the aperture 137. For example, the capping layer 138 may be formed immediately after the formation of the first conductive portion 131 and the second conductive portion 132 depicted in FIG. 9B.

Referring to FIG. 1B, the method 20 proceeds to operation 23 by forming a dielectric layer over the first conductive portion, the second conductive portion, and the spacing, such that an air gap is formed in the spacing between the first and second conductive portions and is sealed by the dielectric layer. FIG. 12A illustrates the formation of a dielectric layer 140. The dielectric layer 140 is over the first conductive portion 131, the second conductive portion 132, and the spacing 135. An air gap 142 is formed in the spacing or the void region 136 under the dielectric layer 140 between the first and second conductive portions 131, 132. The spacing or the void region 136 is not filled with the dielectric layer 140 so to form the air gap 142 under the dielectric layer 140. The air gap 142 is sealed by the dielectric layer 140.

According to another aspect of the present disclosure, a semiconductor structure is provided. FIG. 12A illustrates a cross-sectional view of a semiconductor structure 300 according to various embodiments of the present disclosure. FIG. 12B is a top view of FIG. 12A according to some embodiments of the present disclosure. FIG. 12A is approximately taken along line A-A' in FIG. 12B. As shown in FIGS. 12A and 12B, the semiconductor structure 300 includes a first dielectric layer 110, a first conductive wiring 131, a second conductive wiring 132, a second dielectric layer 140 and an air gap 142 (also referred to as void gap 142).

The first conductive wiring 131 and second conductive wiring 132 extend over the first dielectric layer 110. The first conductive wiring 131 and the second conductive wiring 132 respectively have a first sidewall 131s and a second sidewall 132s. The second sidewall 132s is opposite to the first sidewall 131s. The first sidewall 131s and the second sidewall 132s form an acute angle θ. In some embodiments, the acute angle θ may be ranged from about 5 degrees to about 40 degrees, for example about 7 degrees, about 12 degrees, about 15 degrees, about 20 degrees, and about 30 degrees. A spacing is presented between the first sidewall 131s and the second sidewall 132s.

The second dielectric layer 140 is disposed over the first conductive wiring 131 and the second conductive wiring 132. The second dielectric layer 140 seals the spacing between the first and second sidewalls 131s, 132s. The second dielectric layer 140 does not fully fill the spacing between the first and second sidewalls 131s, 132s. An air gap 142, therefore, is formed under the second dielectric layer 140 and between the first and second sidewalls 131s, 132s.

In some embodiments, as shown in FIG. 12B, the second conductive wiring 132 may extend in an extension direction D1. The second conductive wiring 132 is at least partially aligned with the first conductive wiring 131 in a perpendicular direction D2, which is orthogonal to the extension direction D1. In some examples, the second conductive wiring 132 has a section 132a aligned with the first conductive wiring 131. The length L1 of the air gap 142 along the extension direction D1 is substantially equal to the length L2 of the section 132a of the second conductive wiring 132. The term "substantially equal to" herein refers to that the difference between the length L1 and the length L2 is less than or equal to triple width W1 of the air gap 142, in which the width W1 is the maximum width of the air gap 142. In some examples, the length L1 and the length L2 satisfy the following formula (I):

$$|L1-L2|<(3\times W1) \qquad \text{formula (I)}.$$

In yet some examples, the length L1 and the length L2 satisfy the following formula (II):

$$|L1-L2|<(2\times W1) \qquad \text{formula (II)}.$$

In yet some examples, the length L1 and the length L2 satisfy the following formula (III):

$$|L1-L2|<(W1) \qquad \text{formula (III)}.$$

In yet some embodiments, a third conductive wiring 133 is included in the semiconductor structure 300, as shown in FIG. 12B. The first conductive wiring 131 extends in a direction D1, and has a section 131a aligned with the third conductive wiring 133 in a perpendicular direction D2. An air gap 143 is existed between the conductive wiring 131 and the third conductive wiring 133. The length L3 of the air gap 143 along the direction D1 is substantially equal to the length L3 of the section 131a of the first conductive wiring 131. In some examples, the air gap 143 and the air gap 142 are arranged at opposite sides of the first conductive wiring 131. Furthermore, the length L3 of the air gap 143 is different from the length L1 a of the air gap 142.

In yet some embodiments, the air gap 142 includes an upper portion 135 (indicated in FIG. 10), a bottom portion 137, and a neck portion 136n there between, the neck portion 136n has a minimum width W4 from the upper portion 135 to the bottom portion 137. In some examples, the upper portion 135 has a maximum width W5, and a ratio of the minimum width W4 to the minimum width W5 is ranged from about 0.5 to about 0.95. In some examples, the bottom portion 137 of the air gap 142 extends into the first dielectric layer 110.

In yet some embodiments, one or more via contacts 134 may be included in the semiconductor structure 300. The via contacts 134 is formed or embedded in the first dielectric layer 110. The via contact 134 is connected to at least one of the first and second conductive wirings 131, 132.

In accordance with one aspect of some embodiments, a method includes the following operations: forming a conductive layer over a substrate; selectively etching the conductive layer to form a first conductive portion, a second conductive portion, and a spacing between the first conductive portion and the second conductive portion; and forming a dielectric layer over the first conductive portion, the second conductive portion, and the spacing, such that an air gap is formed in the spacing between the first and second conductive portions and is sealed by the dielectric layer.

In accordance with another aspect of some embodiments, a method of forming a semiconductor structure includes the following operations: forming a first dielectric layer over a substrate; forming a via opening in the first dielectric layer; forming a barrier layer lining the via opening and covering the first dielectric layer; forming a conductive layer overlaying the barrier layer and filling the via opening; patterning the conductive layer and the barrier layer to form a first conductive portion, a second conductive portion, and a spacing there between; and forming a second dielectric layer covering the spacing and the first and second conductive portions to enclose a void gap in the spacing.

In accordance with another aspect of some embodiments, a semiconductor structure includes a first dielectric, a first conductive wiring, a second conductive wiring, and a second dielectric layer. The first conductive wiring extends over the first dielectric layer and has a first sidewall. The second conductive wiring extends over the first dielectric layer and has a second sidewall opposite to the first sidewall. The second dielectric layer is over the first conductive wiring and the second conductive wiring. The air gap is under the second dielectric layer between the first sidewall and the second sidewall. The first sidewall and the second sidewall form an acute angle.

What is claimed is:

1. A method of forming an interconnect structure, comprising:
    depositing a first dielectric layer over a substrate;
    depositing an etching stop layer over the first dielectric layer;
    etching a via opening in the etching stop layer and the first dielectric layer;
    depositing a barrier layer over a bottom surface and a sidewall of the via opening and over a top surface of the etching stop layer;
    forming a conductive layer in the via opening, over the barrier layer, and over the etching stop layer;
    etching the conductive layer and the barrier layer to form a first conductive portion, a second conductive portion, and a spacing between the first conductive portion and the second conductive portion, wherein a bottom-most portion of the spacing is above a top-most surface of the first dielectric layer;
    removing a first portion of the etching stop layer under the spacing, while remaining a second portion of the etching stop layer such that a bottom-most surface of the second portion of the etching stop layer is above a bottom-most surface of the first conductive portion, and such that a sidewall of the second portion of the etching stop layer has a different shape from a sidewall of the first conductive portion; and
    forming a second dielectric layer over the first conductive portion, the second conductive portion, and the spacing, such that an air gap is formed in the spacing between the first and second conductive portions and is sealed by the second dielectric layer.

2. The method according to claim 1, further comprising forming a metal capping layer covering the first and second conductive portions after etching the conductive layer.

3. The method according to claim 1, wherein the spacing comprises an inlet and a bottom, and a width of the inlet is greater than a width of the bottom.

4. The method of claim 1, wherein the removing the first portion of the etching stop layer is performed such that the sidewall of the remaining second portion of the etching stop layer is curved.

5. A method of forming a semiconductor structure, comprising:
   forming a first dielectric layer over a substrate;
   forming an etching stop layer over the first dielectric layer;
   forming a via opening in the etching stop layer and the first dielectric layer;
   overfilling the via opening with a conductive layer;
   forming a masking layer over the conductive layer;
   etching the conductive layer to form separated first and second conductive portions using the masking layer as an etching mask;
   removing the masking layer;
   etching the etching stop layer after removing the masking layer; and
   forming a second dielectric layer over the separated first and second conductive portions such that an air gap is formed under a bottom-most surface of a portion of the second dielectric layer that is between the separated first and second conductive portions, and such that the air gap extends to higher elevation than a top of the first conductive portion.

6. The method of claim 5, wherein the forming the second dielectric layer comprises spin-on coating a dielectric material on the first dielectric layer and the separated first and second conductive portions.

7. The method of claim 6, wherein the spin-on coating is performed such that the dielectric material is formed on a sidewall of the first conductive portion farthest away from the second conductive portion.

8. The method of claim 5, wherein the etching the conductive layer stops until reaching the first dielectric layer.

9. The method of claim 5, wherein the forming the first dielectric layer comprises forming a low-k dielectric layer over the substrate and forming an etch stop layer over the low-k dielectric layer, wherein the etching the conductive layer stops until reaching the etch stop layer.

10. The method of claim 9, wherein a portion of the etch stop layer is exposed after the etching the conductive layer, and the method further comprises removing the exposed portion of the etch stop layer such that a portion of the low-k dielectric layer is exposed.

11. The method of claim 10, wherein the forming of the second dielectric layer comprises spin-coating a dielectric material on the exposed portion of the low-k dielectric layer.

12. The method of claim 5, wherein an etchant used in the etching the conductive layer comprises at least one of Cl2, F2, H2, and CxFy.

13. The method of claim 5, wherein the etching the conductive layer is a reactive ion etching (ME) process using at least one of Cl2, F2, H2, and CxFy as an etchant.

14. The method of claim 5, further comprising performing a chemical mechanical polishing (CMP) process to the conductive layer prior to the etching the conductive layer.

15. The method of claim 14, wherein the CMP process stops at a position higher than a top surface of the first dielectric layer.

16. A method of forming a semiconductor structure, comprising:
   forming a first dielectric layer over a substrate;
   forming an etching stop layer over the first dielectric layer;
   forming a via opening in the etching stop layer and the first dielectric layer;
   forming a conductive layer in the via opening and over the etching stop layer;
   forming an opening in the conductive layer and the etching stop layer to expose a portion of the first dielectric layer, wherein the etching stop layer has a concave sidewall exposed to the opening; and
   forming a second dielectric layer over the conductive layer by a spin-on coating process, such that the second dielectric layer over the opening of the conductive layer is separated from the exposed portion of the first dielectric layer by an air gap having a bottom in a position lower than a top of the via opening.

17. The method of claim 16, further comprising forming a barrier layer in the via opening and over the first dielectric layer prior to the forming the conductive layer, wherein the conductive layer is formed over the barrier layer, and the forming the opening in the conductive layer further forms an opening in the barrier layer to expose the portion of the first dielectric layer.

18. The method of claim 17, wherein forming the opening is performed such that the concave sidewall of the etching stop layer is vertically below the barrier layer.

19. The method of claim 16, further comprising forming a capping layer over the conductive layer prior to the forming the second dielectric layer, wherein the second dielectric layer is formed over the capping layer.

20. The method of claim 16, further comprising performing a chemical mechanical polishing (CMP) process to the conductive layer prior to the forming the opening in the conductive layer, wherein the CMP process stops before reaching the first dielectric layer.

* * * * *